(12) United States Patent
Kim

(10) Patent No.: US 6,228,723 B1
(45) Date of Patent: May 8, 2001

(54) METHOD FOR FORMING SPLIT GATE NON-VOLATILE MEMORY CELLS WITHOUT FORMING A CONDUCTIVE LAYER ON A BOUNDARY REGION BETWEEN A MEMORY CELL ARRAY AND PERIPHERAL LOGIC

(75) Inventor: Yong-Tae Kim, Yongin (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/216,667

(22) Filed: Dec. 16, 1998

(30) Foreign Application Priority Data

Dec. 17, 1997 (KR) .................................................. 97-69989

(51) Int. Cl.⁷ .................................................. H01L 21/336
(52) U.S. Cl. .............................. 438/283; 438/261; 437/43
(58) Field of Search .................................. 438/283, 257, 438/261, 265, 277, 260, 264; 437/43, 49, 69, 979, 985

(56) References Cited

U.S. PATENT DOCUMENTS 5,173,436 * 12/1992 Gill et al. ............................ 437/43
6,054,350 * 4/2000 Hsieh et al. ...................... 438/261

* cited by examiner

*Primary Examiner*—David Nelms
*Assistant Examiner*—Phuc T. Dang
(74) *Attorney, Agent, or Firm*—Skjerven Morrill MacPherson LLP; David W. Heid

(57) ABSTRACT

A method for forming a split gate non-volatile memory cell in a semiconductor device is described. The semiconductor device is defined by a cell array region, a boundary region, and a peripheral logic region. The method eliminates the formation of a conductive layer in the boundary region. The method comprises forming a field oxide layer supported by a semiconductor substrate, forming a gate oxide layer adjacent to the field oxide layer, forming a first conductive layer on the field oxide layer and the gate oxide layer, forming an interpoly oxide layer on the first conductive layer, patterning the first conductive layer and the interpoly oxide layer to develop a terminal edge portion on the field oxide layer overlying the boundary region, forming a second conductive layer over the semiconductor substrate, and patterning the first conductive layer, the second conductive layer and the interpoly oxide layer to from a split gate non-volatile memory cell in the cell array region, wherein the semiconductor substrate does not support any portion of the first and second conductive layers in the boundary region.

9 Claims, 6 Drawing Sheets

METHOD FOR FORMING SPLIT GATE NON-VOLATILE MEMORY CELLS WITHOUT FORMING A CONDUCTIVE LAYER ON A BOUNDARY REGION BETWEEN A MEMORY CELL ARRAY AND PERIPHERAL LOGIC

FIELD OF THE INVENTION

The present invention relates to a method for forming a split gate non-volatile memory cell on a semiconductor substrate, and more particularly to a method for forming a split gate non-volatile memory cell without forming a conductive layer on a boundary region between a memory cell array and peripheral logic in a semiconductor substrate.

BACKGROUND OF THE INVENTION

Non-volatile memory devices, including erasable programmable read only memory (EPROM) and electrically erasable programmable read only memory (EEPROM), have the capability of maintaining stored information after the power supply is removed. One type of EPROM includes a single transistor cell having a control gate and a floating gate, the floating gate being between the control gate and a silicon substrate. An EEPROM cell generally employs two transistors.

The conventional method of forming a split gate non-volatile memory cell in a semiconductor device is depicted in FIGS. 1A to 1D. Referring to FIG. 1A, a semiconductor substrate 10 has a cell array region a, a boundary region b, and a peripheral logic region (not shown). A field oxide layer 12 is formed in and on semiconductor substrate 10. A gate oxide layer 13 is formed over an active region of the cell array region a. To manufacture a floating gate of a transistor, a first conductive or polysilicon layer 14 is formed on the field oxide layer 12 and the gate oxide layer 13. An interpoly oxide layer 16 is disposed on the first polysilicon layer 14. The first polysilicon layer 14 and the interpoly oxide layer 16 are patterned to produce a terminal edge 15, which is over the boundary region b. For control gates of memory cells and gates of transistors in the peripheral logic region, a second conductive or polysilicon layer 18 is formed over the semiconductor substrate 10. A self aligned etching mask 20, e.g., a photoresist pattern, is deposited on selected portions of the second polysilicon layer 18. Referring to FIG. 1B, portions of the first and second polysilicon layers 14 and 18 and the interpoly oxide layer 16, which are not protected by the mask 20, are removed to produce a split gate 22. The split gate 22 includes a control gate 18a and a floating gate 14a, separated by a remaining portion 16a of the interpoly oxide layer. Thereafter, the mask 20 is removed. The remaining structure additionally includes conductive layers 18b and 14b, and an interpoly oxide layer 16b overlying boundary region b.

Referring to FIG. 1C, a second mask or photoresist layer 24 is selectively formed on the resulting structure of FIG. 1B. The photoresist layer 24 does not cover a selected portion 19 of the conductive layer 18b. The exposed portion 19 of the second conductive layer 18 is then etched to form the gates (not shown) of transistors in the peripheral logic region.

The second photoresist layer 24 is removed to produce the structure illustrated in FIG. 1D. As shown in FIG. 1D, an electrically conductive structure 26, which includes the conductive layers 14b and 18b and interpoly oxide layer 16b, overlies boundary region b. The conductive structure 26 can cause a local charge-up phenomenon during the photolithography process. The charge-up can produce an arc or electrical discharge that causes structural damage or creates polysilicon particle contamination. Accordingly, a process is desired which eliminates the formation of a conductive layer overlying the boundary region b.

SUMMARY OF THE INVENTION

The present invention is intended to solve the aforementioned problems by providing a method for forming split gate non-volatile memory cells without leaving a conductive layer overlying a boundary region of a semiconductor substrate.

The method includes forming a field oxide layer in and on the semiconductor substrate, forming a gate oxide layer on the semiconductor substrate and adjacent to the field oxide layer, forming a first conductive layer on the field oxide layer and the gate oxide layer, forming an oxide layer on the first conductive layer, patterning the first conductive layer and the oxide layer to create a terminal edge on the field oxide layer in the boundary region, forming a second conductive layer over the semiconductor substrate, and patterning the first conductive layer, the second conductive layer and the oxide layer to form the split gate non-volatile memory cell in a cell array region of the semiconductor substrate. The patterning removes any conductive layer formed in the boundary region.

In accordance with one embodiment of the present invention, the patterning to form the split gate comprises forming a first masking pattern on a selected portion of the second conductive layer, wherein the first masking pattern does not cover a portion of the second conductive layer overlying the terminal edge; etching and removing portions of the second conductive layer, the oxide layer, and the first conductive layer not positioned under the first masking pattern to form the split gate in the cell array region; removing the first masking pattern; forming a second masking pattern to cover the split gate; and etching and removing any portion of the second conductive layer remaining in the boundary region.

In accordance with another embodiment of the present invention, the patterning to form a split gate comprises forming a first masking pattern to cover the second conductive layer overlying the oxide layer; etching and removing portions of the second conductive layer not covered by the first masking pattern; removing the first masking pattern; forming a second masking pattern over the semiconductor substrate, wherein the second masking pattern does not cover any portion of the second conductive layer in the boundary region, and wherein the second masking pattern covers a selected portion of the second conductive layer overlying the cell array region; and etching and removing portions of the second conductive layer, the interpoly oxide layer, and the first conductive layer not positioned under the second masking pattern to form the split gate.

DETAILED DESCRIPTION OF THE PREFERRED EMBODIMENTS

This application is substantially similar to Korean Patent Application No. 97-69989, filed on Dec. 17, 1997, the disclosure of which is incorporated herein by reference in its entirety.

Figure 1A:
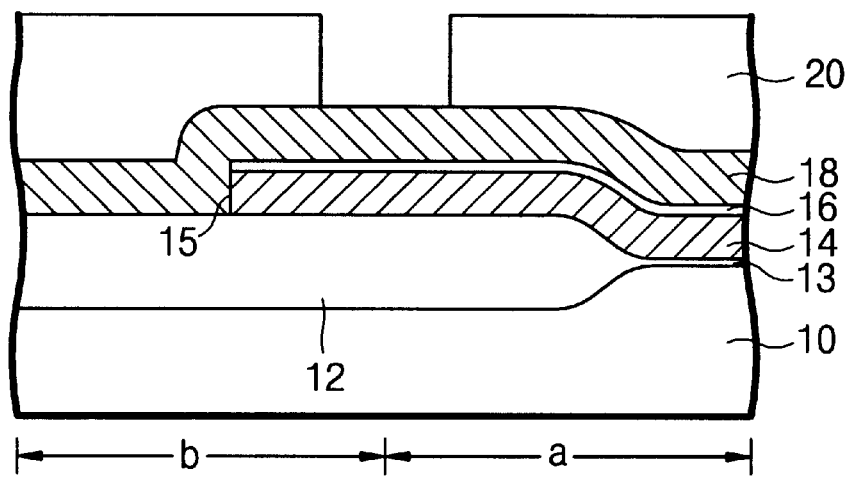
FIGS. 1A to 1D are partial cross-sectional representations of stages in the formation of a prior art split gate non-volatile memory cell in a semiconductor device.
Figure 1B:
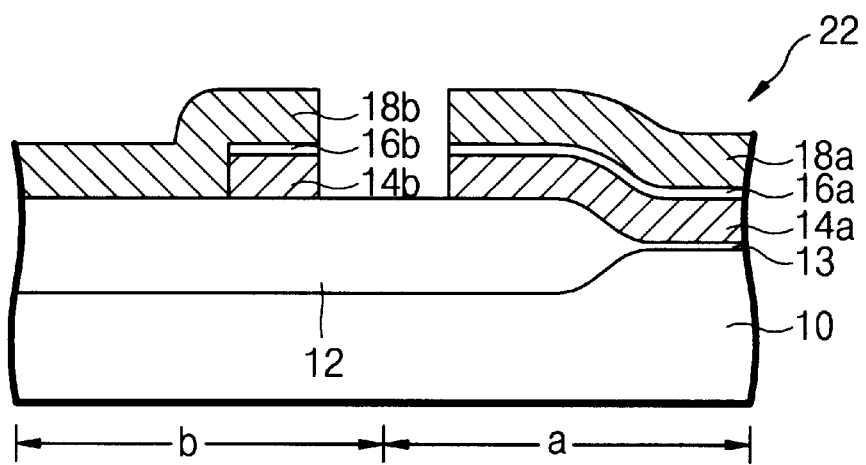
Figure 1C:
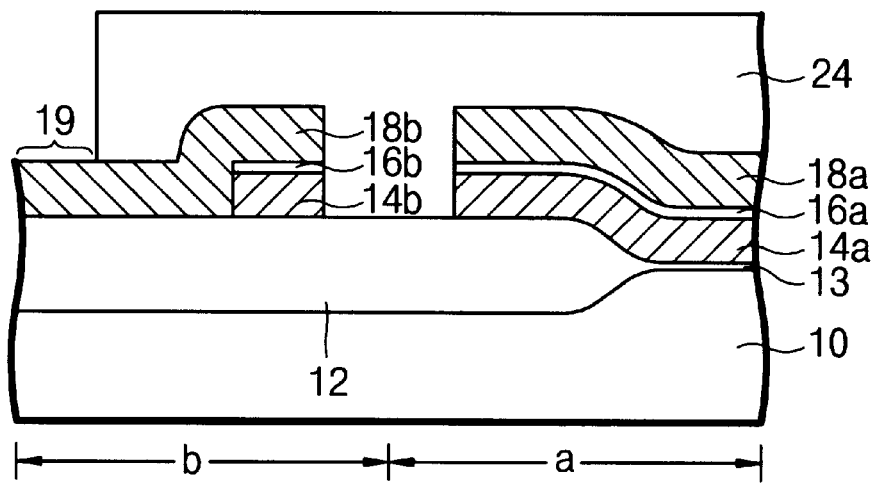
Figure 1D:
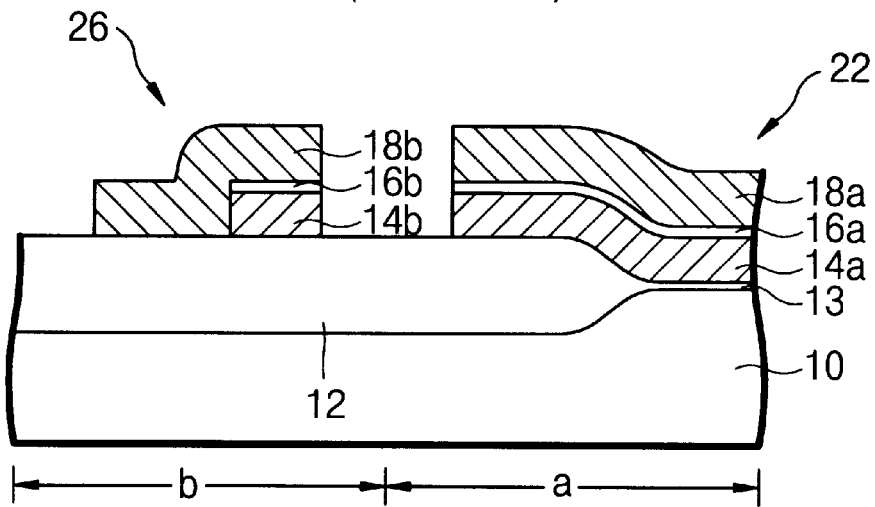
Figure 2A:
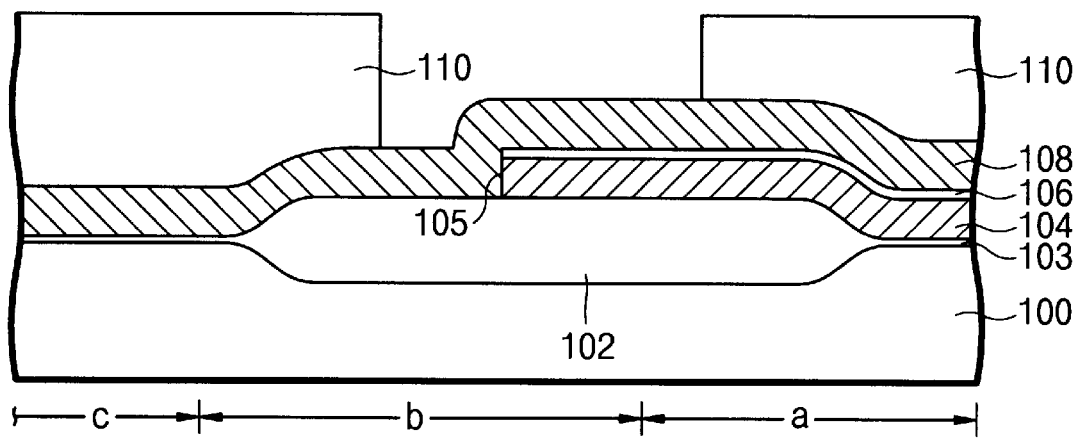
FIGS. 2A to 2D are partial cross-sectional representations of stages in the formation of a split gate non-volatile memory cell in a semiconductor device, in accordance with one embodiment of the present invention.

The preferred embodiment of the invention will now be described with reference to the accompanying drawings, wherein similar parts of the invention are referred to by the same reference numerals. The Figures have been simplified for ease of understanding and describing the invention. FIG. 2A is a partial cross sectional view of a semiconductor substrate 100 having a memory cell array region a, a peripheral logic region c, and a boundary region b positioned therebetween. A field oxide layer 102 defines an inactive region of the cell array region a and the boundary region b. A gate oxide layer 103 defines an active region of the cell array region a and peripheral logic region c. A first conductive layer 104 (e.g., polysilicon layer) is formed on the gate oxide layer 103 and the field oxide layer 102. An interpoly oxide layer 106, such as an ONO (oxide-nitride-oxide) layer, is formed on the first conductive layer 104. The interpoly oxide layer 106 and first conductive layer 104 are patterned to create a terminal edge 105 positioned on the field oxide layer 102 in the boundary region b. A second conductive layer 108 (e.g., polysilicon layer) is deposited over the semiconductor substrate 100. The first conductive layer 104 and the second conductive layer 108 are to be utilized as a floating gate and a control gate, respectively, of memory cells in the cell array region a. Second conductive layer 108 is also for forming gates of transistor in peripheral logic region c.

A first masking pattern 110 (e.g., photoresist) is selectively formed on the second conductive layer 108, but for a portion of the second conductive layer 108 overlying the terminal edge 105 and regions (not shown) between memory cells in cell array region a. As illustrated in FIG. 2A, a selected region surrounding the terminal edge 105 is also free from protection of the first masking pattern 110. All portions of the first and second conductive layers 104 and 108 and interpoly oxide layer 106 are removed, except for the portions marked by numerals 104a, 106a, 108a, and 108b in FIG. 2B.

Figure 2B:
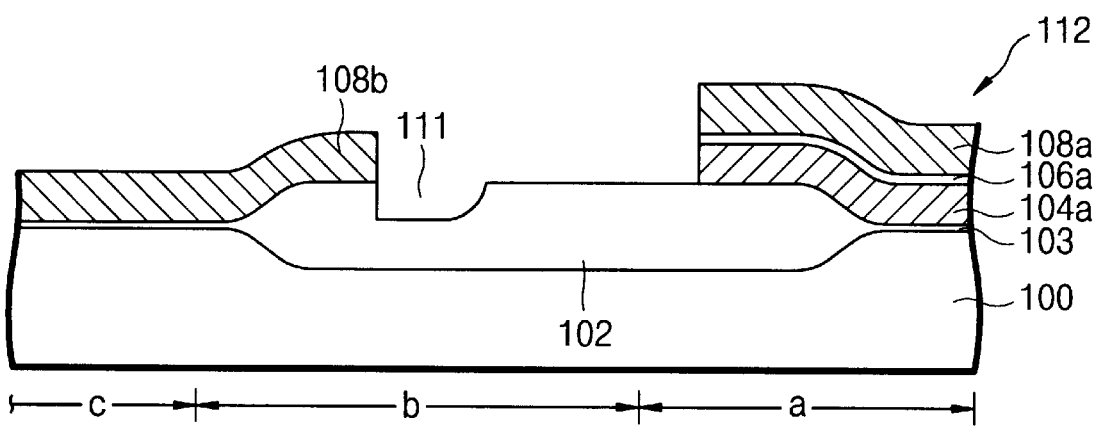

In FIG. 2B, a split gate 112, positioned in the cell array region a, is produced from the above-described etching and removing process. The split gate 112 consists of a control gate 108a, a floating gate 104a, and an intermediate interpoly oxide layer 106a. The first masking pattern 110 is then removed.

During the etching process, a portion of the field oxide layer 102 is etched away in the boundary region b, as represented by reference numeral 111. This is caused by the differences in the height and composition between the single layer of the second conductive layer 108 and the triple layer of the first conductive layer 104, the second conductive layer 108, and interpoly oxide layer 106.

Figure 2C:
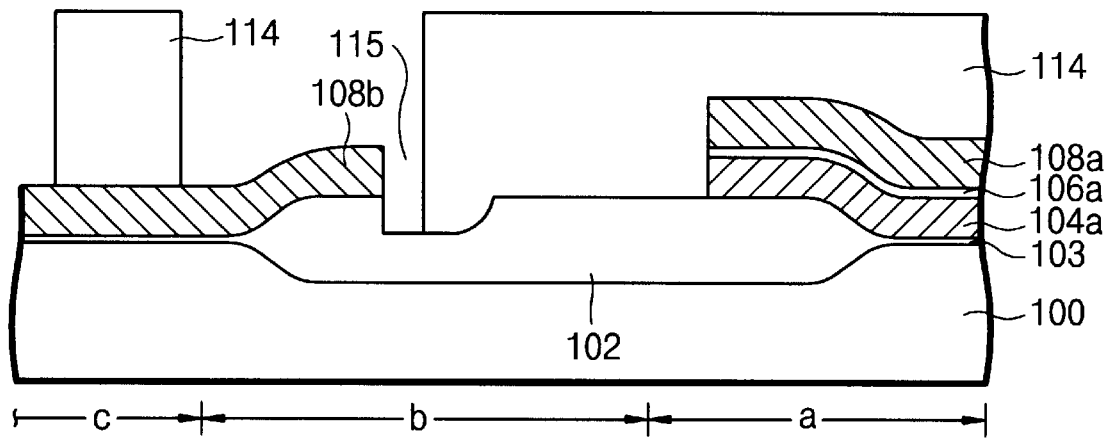
Figure 2D:
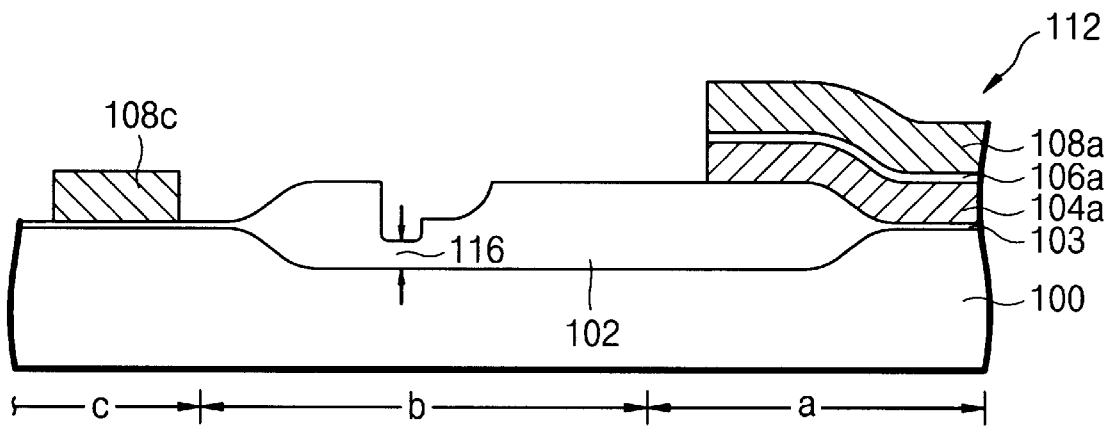

Referring to FIG. 2C, a second photolithography process is performed to form gates in the peripheral region c by patterning the second conductive layer 108 in the boundary region b and the peripheral region c. A second masking pattern 114 (e.g., photoresist) is selectively formed to cover the control gate 108a, the floating gate 104a, and the intermediate interpoly oxide layer 106a in cell array region a. The second masking pattern 114 covering the control gate 108a, the floating gate 104a, and the intermediate interpoly oxide layer 106a extends over a selected portion of the field oxide layer 102. The second masking pattern 114 also protects a portion of the conductive layer 108b in the peripheral logic region c. A portion of the second conductive layer 108b that is not protected by the masking pattern 114 is removed from the boundary region b and parts of the peripheral logic region c. Accordingly, any conductive layer disposed over the boundary region b is removed. During this second photolithography process, a portion of the field oxide layer 102 in area 115 (i.e., area not covered by the photoresist layer 114) is over-etched, as represented by reference numeral 116 (FIG. 2D). For example, a field oxide 102 layer having a thickness of about 4000 Å can be over-etched by about 2000 Å. The etching leaves a gate 108c for a transistor in the peripheral logic region c.

Figure 3A:
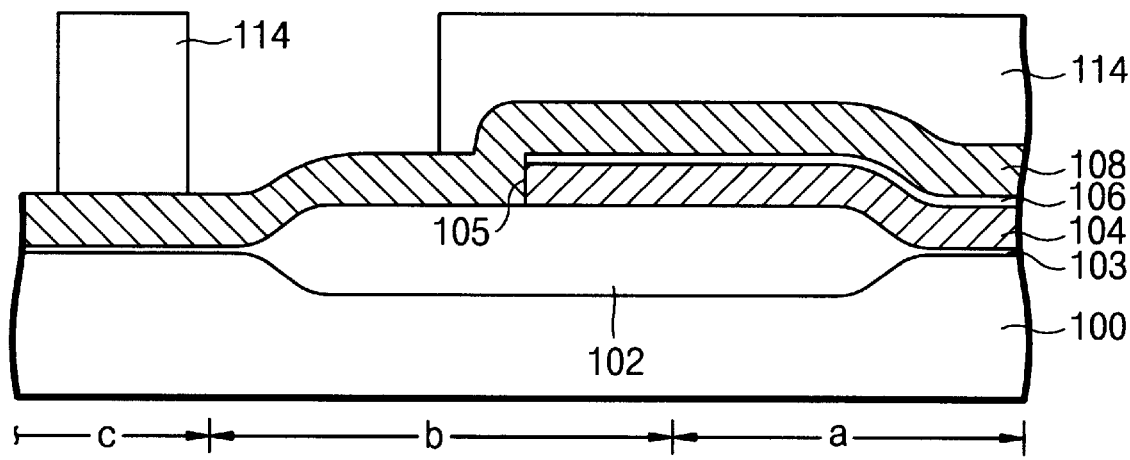
FIGS. 3A to 3D are partial cross-sectional representations of stages in the formation of a split gate non-volatile memory cell in a semiconductor device, in accordance with another embodiment of the present invention.

In the above method, the process sequence of the first and second photolithography and etching may be reversed. In other words, the second photolithography and etching process for forming the gate 108c in the peripheral logic region c can be performed before the first photolithography and etching process for forming the split gate 112 in the cell array region a. Referring to FIG. 3A, the second masking pattern 114 of FIG. 2C is formed over the semiconductor substrate 100. The second masking pattern 114 covers a portion of the second conductive layer 108 overlying the interpoly oxide layer 106. Additionally, the masking pattern 114 covers a selected portion of the second conductive layer 108 overlying the peripheral logic region c. A portion of the second conductive layer 108 not protected by the masking pattern 114 is removed to form the gate 108c in the peripheral logic region c, as illustrated in FIG. 3B.

Figure 3B:
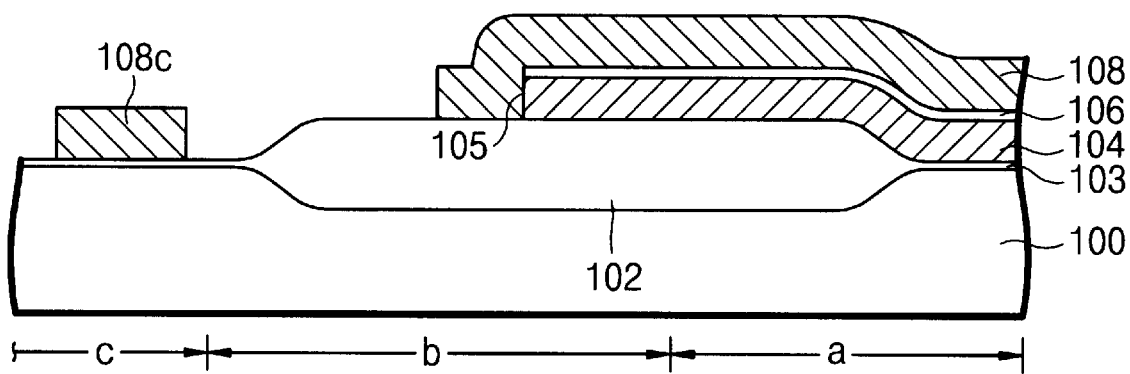
Figure 3C:
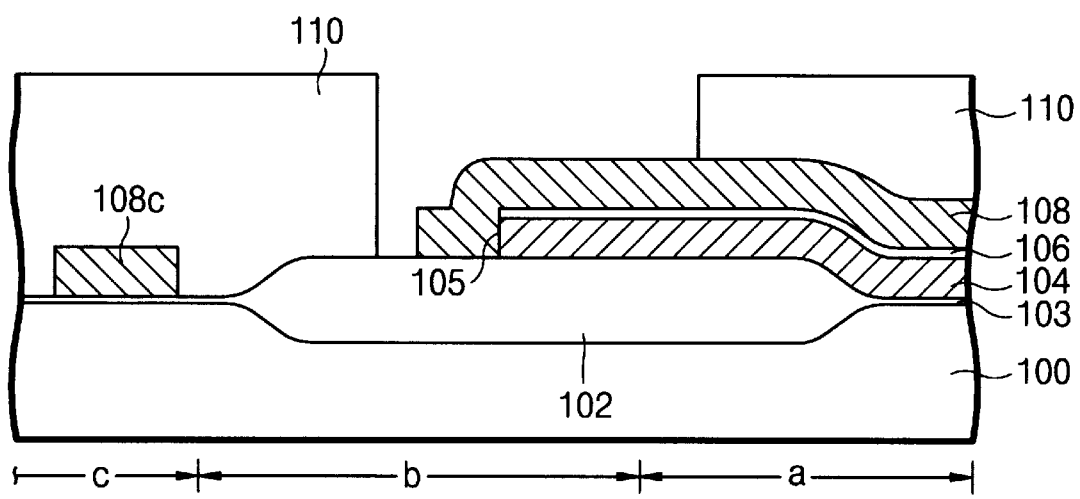
Figure 3D:
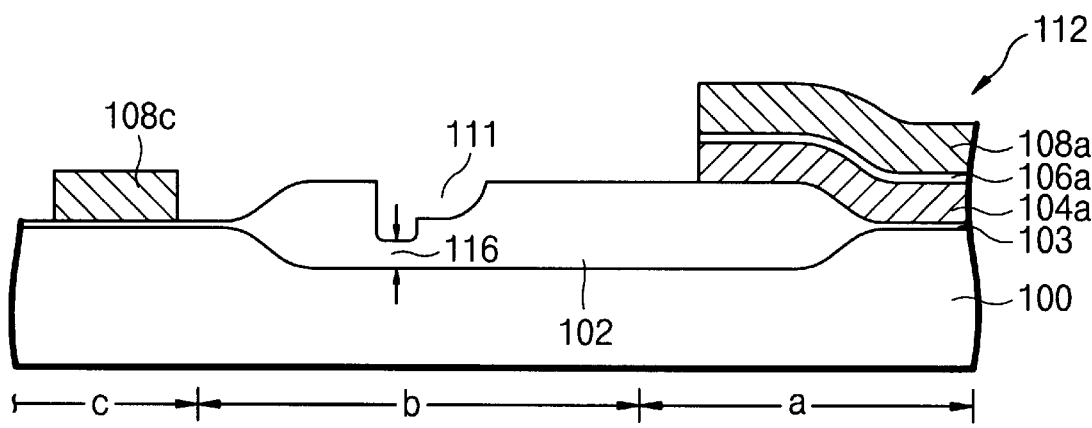

After removing the second masking pattern 114, the first masking pattern 110 of FIG. 2A is selectively formed over the resulting structure of FIG. 3B. Referring to FIG. 3C, the first masking pattern 110 protects the gate 108c in the peripheral logic region c, and covers a portion of the second conductive layer 108 in the cell array region a. Referring to FIG. 3D, the portions of the second conductive layer 108, interpoly oxide layer 106, and first conductive layer 104 that are not protected by the first masking pattern 110 are etched (e.g., self-aligned etching) and removed to form the split gate 112 in the cell array region a. The etching process removes any conductive layer in the boundary region b.

While particular embodiments of the present invention have been shown and described, it will be obvious to those skilled in the art that changes and modifications can be made without departing from this invention in its broader aspects and, therefore, the appended claims are to encompass within their scope all such changes and modifications as fall within the true spirit and scope of this invention.

What is claimed is:

1. A method for forming a split gate non-volatile memory cell in a semiconductor substrate, said semiconductor substrate having a boundary region and a cell array region adjacent to said boundary region, comprising:

forming a field oxide layer supported by said semiconductor substrate;

forming a gate oxide layer adjacent to said field oxide layer and supported by said semiconductor substrate;

forming a first conductive layer on said field oxide layer and said gate oxide layer;

forming an oxide layer on said first conductive layer;

patterning said first conductive layer and said oxide layer to create a terminal edge portion on said field oxide layer overlying said boundary region;

forming a second conductive layer over said semiconductor substrate;

forming a first masking pattern on a selected portion of said second conductive layer, wherein said first masking pattern does not cover a portion of said second conductive layer overlying said terminal edge portion;

etching and removing portions of the said second conductive layer, said oxide layer and said first conductive layer not positioned under said first masking pattern to from said split gate in said cell array region;

removing said first masking pattern;

forming a second masking pattern covering said split gate; and etching and removing any portion of said second conductive layer remaining in said boundary region.

2. The method of claim 1, wherein said semiconductor substrate additionally comprises a peripheral logic region having said second conductive layer formed thereon, wherein said forming a second masking pattern additionally comprises forming said second masking pattern on a portion of said second conductive layer overlying said peripheral logic region, and wherein said etching and removing creates a gate structure in said peripheral logic region.

3. A method for forming a split gate non-volatile memory cell in a semiconductor substrate, said semiconductor substrate having a boundary region and a cell array region adjacent to said boundary region, comprising:

forming a field oxide layer supported by said semiconductor substrate;

forming a gate oxide layer adjacent to said field oxide layer and supported by said semiconductor substrate;

forming a first conductive layer on said field oxide layer and said gate oxide layer;

forming an oxide layer on said first conductive layer;

patterning said first conductive layer and said oxide layer to create a terminal edge portion on said field oxide layer overlying said boundary region;

forming a second conductive layer over said semiconductor substrate;

forming a first masking pattern to cover said second conductive layer overlying said oxide layer;

etching and removing portions of said second conductive layer not covered by said first masking pattern;

removing said first masking pattern;

forming a second masking pattern over said semiconductor substrate, wherein said second masking pattern does not cover any portion of said second conductive layer in said boundary region, and wherein said second masking pattern covers a selected portion of said second conductive layer overlying said cell array region;

etching and removing portions of said second conductive layer, said oxide layer, and said first conductive layer not positioned under said second masking pattern to form said split gate.

4. The method of claim 3 wherein said semiconductor substrate additionally comprises a peripheral logic region having said second conductive layer formed thereon, wherein said forming a first masking pattern additionally comprises forming said first masking pattern on a portion of said second conductive layer overlying said peripheral logic region, and wherein said etching and removing said second conductive layer not covered by said first masking pattern creates a gate structure in said peripheral logic region.

5. The method of claim 4, wherein said forming a second masking pattern additionally comprises forming said masking pattern to cover said gate structure in said peripheral logic region.

6. The method of claim 1, wherein said first conductive layer is a polysilicon layer defining a floating gate of a split gate in said cell array region.

7. The method of claim 1, wherein said second conductive layer is a polysilicon layer defining a control gate of a split gate in said cell array region.

8. The method of claim 3, wherein said first conductive layer is a polysilicon layer defining a floating gate of a split gate in said cell array region.

9. The method of claim 3, wherein said second conductive layer is a polysilicon layer defining a control gate of a split gate in said cell array region.

* * * * *